US011696410B2

(12) United States Patent
Kondoh et al.

(10) Patent No.: US 11,696,410 B2
(45) Date of Patent: Jul. 4, 2023

(54) METHOD FOR PRODUCING WIRING SUBSTRATE

(71) Applicant: TOYOTA JIDOSHA KABUSHIKI KAISHA, Toyota (JP)

(72) Inventors: Haruki Kondoh, Okazaki (JP); Rentaro Mori, Kasugai (JP); Hiroshi Yanagimoto, Miyoshi (JP); Keiji Kuroda, Toyota (JP); Kazuaki Okamoto, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/324,194

(22) Filed: May 19, 2021

(65) Prior Publication Data
US 2021/0378103 A1    Dec. 2, 2021

(30) Foreign Application Priority Data

Jun. 2, 2020 (JP) ................. 2020-096458

(51) Int. Cl.
*C25D 5/02* (2006.01)
*H05K 3/10* (2006.01)
(Continued)

(52) U.S. Cl.
CPC ............. *H05K 3/108* (2013.01); *C25D 5/02* (2013.01); *C25D 5/48* (2013.01); *H05K 3/18* (2013.01); *H05K 2203/0723* (2013.01)

(58) Field of Classification Search
None
See application file for complete search history.

(56) References Cited

U.S. PATENT DOCUMENTS 4,810,332 A * 3/1989 Pan ................. H01L 21/4857
257/E23.072
7,051,934 B2 * 5/2006 Lee .................. H01L 21/76877
257/E21.585
(Continued)

FOREIGN PATENT DOCUMENTS

JP   2014-185371 A    10/2014
KR   101829302    *  2/2018 ............ C25D 15/00

OTHER PUBLICATIONS

English translation JP 2014185371 (Year: 2014).*

*Primary Examiner* — Stefanie S Wittenberg
(74) *Attorney, Agent, or Firm* — Sughrue Mion, PLLC (57) ABSTRACT

The present disclosure provides a method for producing a wiring substrate. A seeded substrate is first prepared. The seeded substrate includes an insulation substrate, a conductive undercoat layer having a hydrophilic surface and provided on the insulation substrate, a conductive seed layer provided on a first region of the surface of the undercoat layer, the first region having a predetermined pattern, and a water-repellent layer on the second region of the surface of the undercoat layer, the second region being a region other than the first region. Subsequently, a metal layer is formed on the seed layer. A voltage is applied between the anode and the seed layer while a solid electrolyte membrane being disposed between the seeded substrate and the anode, and the solid electrolyte membrane and the seed layer being pressed into contact with each other. Thereafter, the water-repellent layer and the undercoat layer are etched.

5 Claims, 11 Drawing Sheets (51) Int. Cl.
*H05K 3/18* (2006.01)
*C25D 5/48* (2006.01)

(56) References Cited

U.S. PATENT DOCUMENTS

| | | | | |
|---|---|---|---|---|
| 7,622,198 B2* | 11/2009 | Miya | ............... | C25D 3/62 |
| | | | | 428/673 |
| 2001/0032787 A1* | 10/2001 | Uzoh | ............... | H01L 24/11 |
| | | | | 257/E21.508 |
| 2005/0136360 A1* | 6/2005 | Nishiyama | ............... | B29D 17/005 |
| 2009/0236627 A1* | 9/2009 | Kim | ............... | H05K 3/1258 |
| | | | | 257/773 |
| 2009/0242250 A1* | 10/2009 | Kohda | ............... | H05K 3/389 |
| | | | | 428/458 |
| 2016/0076162 A1 | 3/2016 | Sato et al. | | |
| 2016/0153106 A1* | 6/2016 | Hugot | ............... | C25D 3/665 |
| | | | | 60/805 |
| 2018/0103642 A1* | 4/2018 | Clevenger | ............... | C25D 11/26 |

\* cited by examiner

METHOD FOR PRODUCING WIRING SUBSTRATE

CROSS REFERENCE TO RELATED APPLICATIONS

The present application claims priority from Japanese patent application JP 2020-096458 filed on Jun. 2, 2020, the content of which is hereby incorporated by reference into this application.

BACKGROUND

Technical Field

The present disclosure relates to a method for producing a wiring substrate.

Background Art

Conventionally, a plating method have been widely used to form a wiring in the production of a wiring substrate (i.e., a wiring board). However, the plating method requires rinsing with water after plating treatment, thereby requiring a processing of waste liquid. In order to overcome such drawback, JP 2014-185371 A discloses a method of forming a metal film comprising disposing a solid electrolyte membrane between an anode and a cathode (a substrate), providing a metal ion-containing solution between the anode and the solid electrolyte membrane, bringing the solid electrolyte membrane into contact with the substrate, and applying a voltage between the anode and the substrate to deposit the metal on the substrate surface.

SUMMARY

When a wiring layer with a predetermined wiring pattern is formed on an insulation substrate according to the method disclosed in JP 2014-185371 A, a metal may be deposited in a region other than the predetermined wiring pattern. The metal deposited in the region other than the predetermined wiring pattern may sometimes induce short circuits between wirings. This necessitates removal of such metal. However, it is difficult to selectively remove the metal deposited in the region other than the predetermined wiring pattern. Accordingly, it is desired to avoid metal deposition in the region other than the predetermined wiring pattern.

The present disclosure provides a method for producing a wiring substrate which allows preventing or reducing metal deposition in a region other than the predetermined wiring pattern.

An aspect of the present disclosure provides a method for producing a wiring substrate including an insulation substrate and a wiring layer having a predetermined wiring pattern and provided on the insulation substrate, the method including steps of:

(a) preparing a seeded substrate including:
the insulation substrate;
a conductive undercoat layer provided on the insulation substrate and having a hydrophilic surface;
a conductive seed layer provided on a first region of the surface of the undercoat layer, the first region having a predetermined pattern corresponding to the wiring pattern; and
a water-repellent layer provided on a second region of the surface of the undercoat layer, the second region being a region other than the first region;

(b) forming a metal layer on a surface of the seed layer, wherein a voltage is applied between an anode and the seed layer while a solid electrolyte membrane containing a metal ion-containing solution being disposed between the seeded substrate and the anode, and the solid electrolyte membrane and the seed layer being pressed into contact with each other; and (c) etching the water-repellent layer and the undercoat layer.

The method of the present disclosure can prevent or reduce metal deposition in the region other than the predetermined wiring pattern.

DETAILED DESCRIPTION

Figure 1:
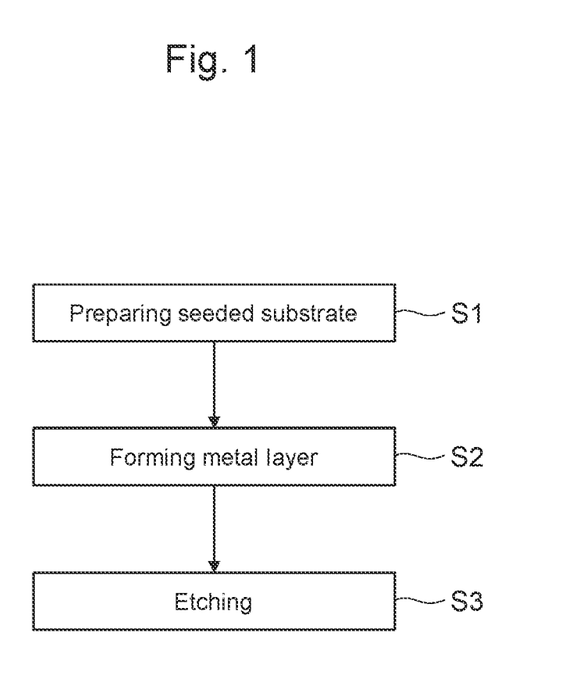
FIG. 1 is a flowchart showing a method for producing a wiring substrate according to an embodiment.
Figure 2:
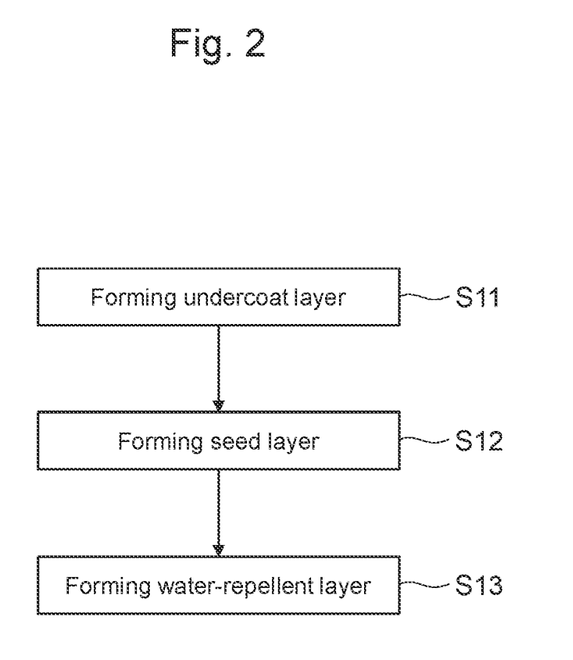
FIG. 2 is a flowchart showing a step of preparing a seeded substrate in the method for producing the wiring substrate according to an embodiment.

As shown in FIG. 1, a method for producing a wiring substrate according to an embodiment includes: a step of preparing a seeded substrate (S1); a step of forming a metal layer (S2); and a step of etching a water-repellent layer and an undercoat layer (S3). As shown in FIG. 2, the step of preparing the seeded substrate (S1) includes: a step of forming the undercoat layer (S11); a step of forming a seed layer (S12); and a step of forming the water-repellent layer (S13). These steps will be described below.

(1) Formation of Undercoat Layer (S11)

Figure 3:
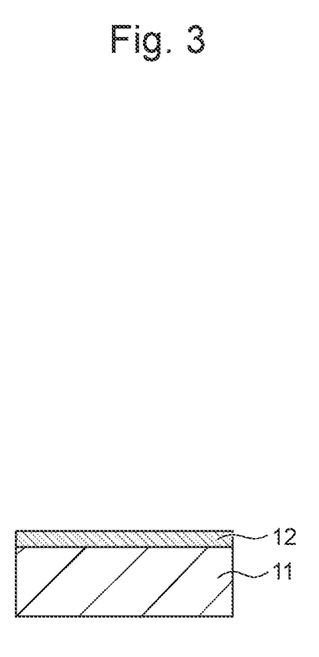
FIG. 3 is a drawing schematically illustrating a step of forming an undercoat layer.

At first, as shown in FIG. 3, the undercoat layer 12 is formed on an insulation substrate 11. Examples of the insulation substrate 11 that can be used include a resin substrate, a glass substrate, and a substrate including resin and glass, such as a glass epoxy resin substrate. Examples of resin used for the insulation substrate 11 include: thermoplastic resin such as epoxy resin, ABS resin, AS resin, AAS resin, PS resin, EVA resin, PMMA resin, PBT resin, PET resin, PPS resin, PA resin, POM resin, PC resin, PP resin, PE resin, PI (polyimide) resin, polymer alloy resin including an elastomer and PP, modified PPO resin, PTFE resin, and ETFE resin; thermosetting resin such as phenolic resin, melamine resin, amino resin, unsaturated polyester resin, polyurethane, diallyl phthalate, silicone resin, and alkyd resin; resin including epoxy resin mixed with cyanate resin; and liquid crystal polymer. In some embodiments, the glass epoxy resin substrate may be used as the insulation substrate 11.

The undercoat layer 12 has sufficient conductivity for the formation of the metal layer 14 described later. The undercoat layer 12 has a hydrophilic group, such as a hydroxyl, amino, or carboxyl group, on its surface, which imparts hydrophilicity to the surface of the undercoat layer 12. For example, the undercoat layer 12 may be formed of a conductive metal oxide, such as $TiO_2$, SnO, GeO, and ITO (indium tin oxide). Alternatively, the undercoat layer 12 may include a layer of Ti, Al, Cr, Si, or alloy containing at least one of these metals, or a layer of metal silicide, such as $FeSi_2$, $CoSi_2$, $MoSi_2$, $WSi_2$, $VSi_2$, $ReSi_{1.75}$, $CrSi_2$, $NbSi_2$, $TaSi_2$, $TiSi_2$, or $ZrSi_2$, and a natural oxide film formed on the surface of the metal or silicide layer. The term "natural oxide film" refers to an oxide film that is naturally formed on the surface of a substance when such substance is left to stand in the air. The natural oxide film has a hydroxyl group on its surface. Examples of natural oxide films include a passive film formed on the surface of Ti, Al, Cr, or an alloy containing at least one of these metals, and a silicon oxide layer formed on the surface of Si or silicide. From the viewpoint of in-plane uniformity of the metal layer 14 described later, the undercoat layer 12 may have a thickness of 20 nm or more. From the viewpoint of production cost, the undercoat layer 12 may have a thickness of 300 nm or less.

The undercoat layer 12 may be formed on the entire surface (a main surface) of the insulation substrate 11. The undercoat layer 12 may be formed by any method. For example, the undercoat layer 12 can be formed by PVD (physical vapor deposition) such as sputtering, CVD (chemical vapor deposition), or electroless plating.

(2) Formation of Seed Layer (S12)

Figure 4:
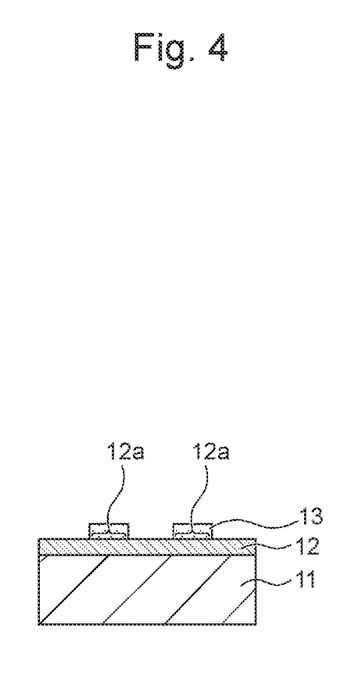
FIG. 4 is a drawing schematically illustrating a step of forming a seed layer.

The seed layer 13 is formed on the first region 12a of the surface of the undercoat layer 12, as shown in FIG. 4. The first region 12a has a predetermined pattern corresponding to a wiring pattern of the wiring substrate produced by the production method according to the present embodiment. The seed layer 13 is electrically connected to the undercoat layer 12.

A material constituting the seed layer 13 is not particularly limited, provided that the material is a conductive material. The material constituting the seed layer 13 may be a noble metal having high oxidation resistance. For example, the seed layer 13 may be formed of at least one metal selected from the group consisting of Pt, Pd, Rh, Cu, Ag, and Au. From the viewpoint of in-plane uniformity of the metal layer 14 described later, the seed layer 13 may have a thickness of 20 nm or more. From the viewpoint of production cost, the seed layer 13 may have a thickness of 300 nm or less.

The seed layer 13 may be formed by any method. For example, the seed layer 13 can be formed by coating the first region 12a with a dispersion of metal particles and solidifying the dispersion. The metal particles may include at least one metal selected from the group consisting of Pt, Pd, Rh, Cu, Ag, and Au. In order to form finer wirings, each of the metal particles may have a smaller diameter. For example, each of the metal particles may have a diameter of 1 nm to 100 nm. Each of the metal particles may also have a diameter of 20 nm or less. The metal particles having such diameters have lower melting points, which facilitates sintering of the metal particles. A dispersion medium for the dispersion may be, for example, a liquid volatilizable by heating, such as decanol. The dispersion may contain an additive. Examples of the additive include straight-chain fatty acid salts having 10 to 17 carbon atoms. Examples of methods of applicating the dispersion include printing methods such as screen printing, inkjet printing, and transfer printing. A method of solidifying the dispersion is not particularly limited. For example, heating may be applied to volatilize the dispersion medium and sinter the metal particles, thereby solidifying the dispersion.

It is also allowable to dispose a metal mask on the undercoat layer 12 and then form the seed layer 13 on the first region 12a by vacuum deposition, sputtering, or the like.

The first region 12a may consist of a single continuous region or it may include a plurality of independent regions. When the first region 12a includes a plurality of independent regions, the seed layers 13 formed on respective independent regions are electrically connected to each other by the undercoat layer 12. Thus, it is not necessary to provide each seed layer 13 on each independent region with a lead wiring, which would otherwise need to be used in the step of forming the metal layer described later.

(3) Formation of Water-Repellent Layer (S13)

Figure 5:
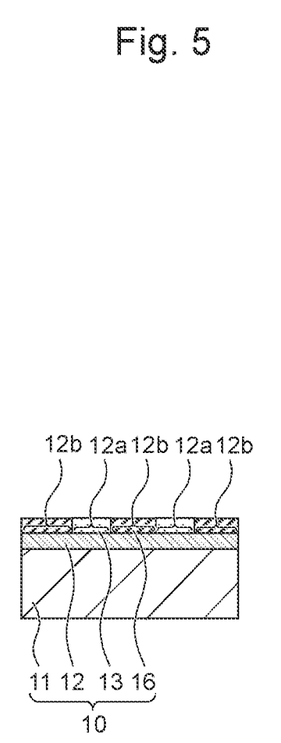
FIG. 5 is a drawing schematically illustrating a step of forming a water-repellent layer.

As shown in FIG. 5, the water-repellent layer 16 is formed on a second region 12b of the surface of the undercoat layer 12. The second region 12b is a region other than the first region 12a in the surface of the undercoat layer 12.

The water-repellent layer 16 can be formed with the use of organic silane represented by a formula: $R_nSiX_{(4-n)}$ or organic silazane represented by a formula: $R_3Si\text{---}(NR\text{---}SiR_2)_m\text{---}R$. In the formulae, n represents 1, 2, 3, or 4, m represents an integer of 1 or larger, R's each independently represent substituted or unsubstituted alkyl, phenyl, trifluoromethyl, alkylsilyl, or fluorosilyl, and X(s) each independently represent(s) hydrogen, halogen, oxygen, or nitrogen. Such organic silane or organic silazane can react with the hydrophilic group on the surface of the undercoat layer 12 via condensation reaction to form a bond. Examples of organic silane include tetraethylsilane, tetramethylsilane, and para-aminophenyltrimethoxysilane. Examples of organic silazane include hexamethyldisilazane (HMDS).

The water-repellent layer 16 can be formed by any method, such as dip coating, mist coating, spray coating, CVD, or the Langmuir Blogetto (LB) method. Mist coating is a method including atomizing a raw material solution containing a metal element with the use of an ultrasonic transducer to form mist, supplying the mist to the substrate, and decomposing and/or reacting the mist on a substrate surface with thermal energy or the like, thereby forming a thin film containing the metal element on the substrate surface. Organic silane or organic silazane, which is a raw material of the water-repellent layer 16, forms a bond with a hydrophilic group on the surface of the undercoat layer 12. This allows the selective formation of the water-repellent layer 16 on the surface of the undercoat layer 12. The water-repellent layer 16 is not formed on a surface of the seed layer 13 having no hydrophilic group. In the present embodiment, accordingly, the water-repellent layer 16 can be selectively formed only on the undercoat layer 12 without a patterning technique such as printing.

Thus, the seeded substrate 10 including the insulation substrate 11, the conductive undercoat layer 12 having a hydrophilic surface and provided on the insulation substrate 11, the conductive seed layer 13 provided on the first region 12a of the surface of the undercoat layer 12, and the water-repellent layer 16 provided on the second region 12b of the surface of the undercoat layer 12 can be obtained. It is not necessary to self-manufacture the seeded substrate 10. The seeded substrate 10 prepared in advance may be purchased commercially.

(4) Formation of Metal Layer (S2)

Figure 6:
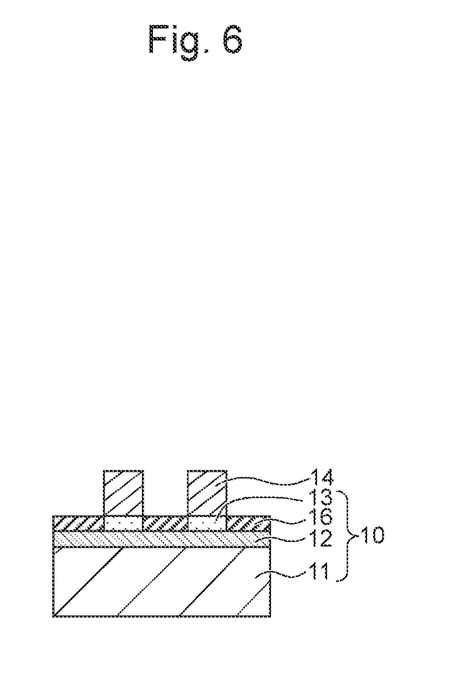
FIG. 6 is a drawing schematically illustrating a step of forming a metal layer.

As shown in FIG. 6, the metal layer 14 is formed on the surface of the seed layer 13. Examples of materials constituting the metal layer 14 include Cu, Ni, Ag, and Au. In some embodiments, the metal layer 14 may be formed of Cu. The metal layer 14 may have a thickness of, for example, 1 µm to 100 µm.

Figure 9:
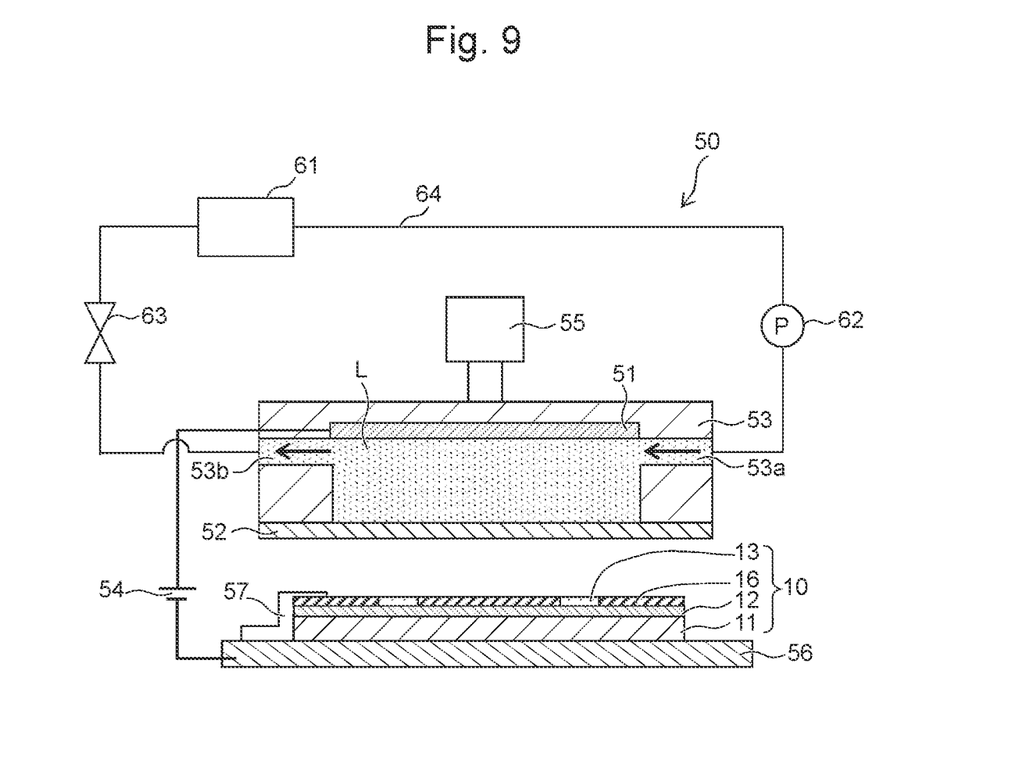
FIG. 9 is a cross-sectional view schematically illustrating a film-forming apparatus used in the step of forming the metal layer.
Figure 10:
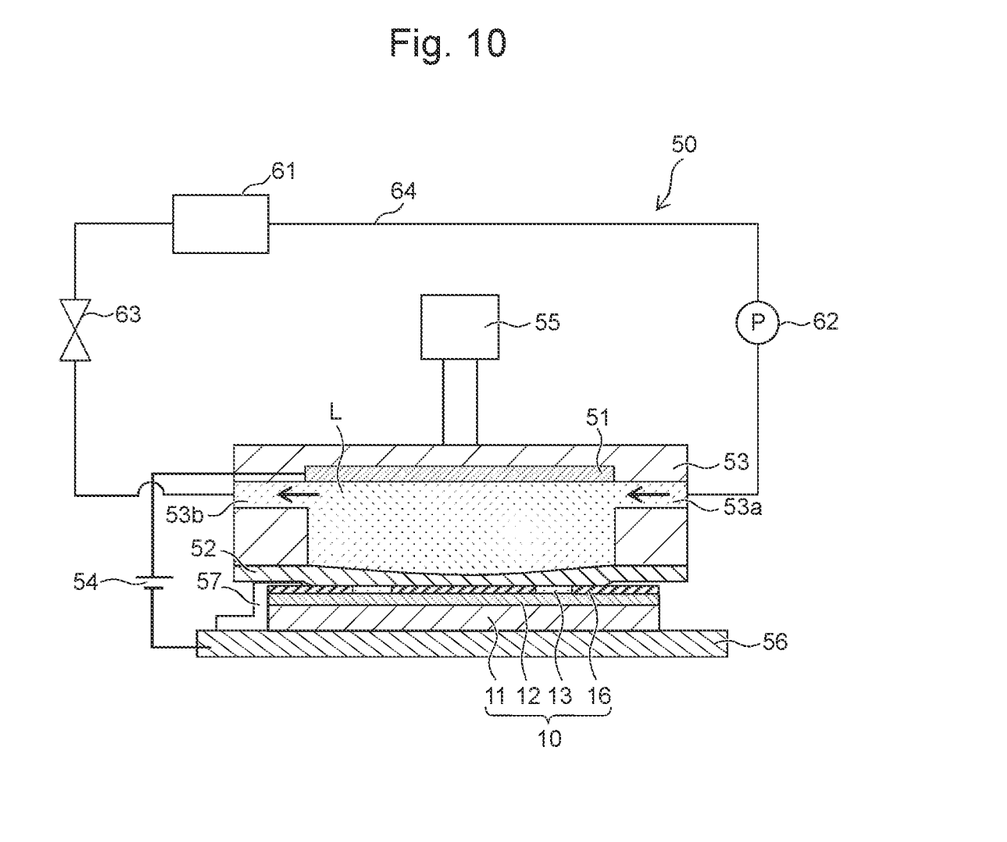
FIG. 10 is a cross-sectional view schematically illustrating the film-forming apparatus of FIG. 9 in which a housing is lowered to a predetermined level.

An example of a film-forming apparatus 50 used to form the metal layer 14 is shown in FIG. 9 and FIG. 10. The film-forming apparatus 50 includes a metal anode 51 provided to oppose the seeded substrate 10, a solid electrolyte membrane 52 provided between the anode 51 and the seeded substrate 10, and a power supply 54 that applies a voltage between the anode 51 and the seed layer 13.

The film-forming apparatus 50 further includes a housing 53. The housing 53 holds the anode 51 and an aqueous solution L containing ions of a metal for constituting the metal layer 14 (hereafter, referred to as a "metal solution L") therein. As shown in FIG. 9, the housing 53 may define a space for accommodating the metal solution L between the anode 51 and the solid electrolyte membrane 52. In this case, the anode 51 may be a plate member formed of a material that is the same as the material constituting the metal layer 14 and soluble in the metal solution L (e.g., Cu) or a plate member formed of a material that is not soluble in the metal solution L (e.g., Ti). In the film-forming apparatus 50 having the space for accommodating the metal solution L between the anode 51 and the solid electrolyte membrane 52, the solid electrolyte membrane 52 can be pressed into contact with the seeded substrate 10 with a uniform pressing force, which allows the metal layer 14 to be uniformly formed on the seed layer 13 over the entire surface of the seeded substrate 10. Such film-forming apparatus 50 may be suitable for forming a fine wiring pattern.

The anode 51 may be in contact with the solid electrolyte membrane 52, although such configuration is not shown in the figures. In such a case, the anode 51 may be formed of a porous body through which the metal solution L can penetrate. The surface of the anode 51 opposite from the surface that is to be brought into contact with the solid electrolyte membrane 52 may be in contact with the space for accommodating the metal solution L.

Examples of materials constituting the solid electrolyte membrane 52 include cation-exchange resin such as fluorine resin (e.g. Nafion® from Du Pont), hydrocarbon resin, polyamic acid resin, or Selemion (CMV, CMD, and CMF series) from AGC. When the solid electrolyte membrane 52 is brought into contact with the metal solution L, the metal solution L is impregnated into the solid electrolyte membrane 52, which results in the solid electrolyte membrane 52 containing the metal solution L therein. The solid electrolyte membrane 52 may have a thickness of, for example, approximately 5 µm to approximately 200 µm.

The metal solution L contains metal which is a raw material of the metal layer 14 (e.g., Cu, Ni, Ag, or Au) in its ionic state. The metal solution L may contain nitrate ion, phosphate ion, succinate ion, sulfate ion, and/or pyrophosphate ion. The metal solution L may be an aqueous solution of metal salt, such as nitrate salt, phosphate salt, succinate salt, sulfate salt, or pyrophosphate salt.

In addition, the film-forming apparatus 50 includes a lifting and lowering device 55 that lifts or lowers the housing 53 on top of the housing 53. The lifting and lowering device 55 may include a hydraulic or pneumatic cylinder, a power-operated actuator, a linear guide, a motor, etc.

The housing 53 is provided with an inlet port 53a and an outlet port 53b. The inlet port 53a and the outlet port 53b are connected to a tank 61 by a piping 64. The metal solution L is transported from the tank 61 with the aid of a pump 62 connected to the piping 64, flows into the housing 53 through the inlet port 53a, discharged from the housing 53 through the outlet port 53b, and then returned to the tank 61. The piping 64 is provided with a pressure regulation valve 63 downstream of the outlet port 53b. With the aid of the pressure regulation valve 63 and the pump 62, a pressure of the metal solution L in the housing 53 can be regulated.

The film-forming apparatus 50 further includes a metal platform 56 on which the seeded substrate 10 is disposed and a conductive member 57 that electrically connects the metal platform 56 to the undercoat layer 12 or the seed layer 13 of the seeded substrate 10 disposed on the metal platform 56. The conductive member 57 may be a metal plate that covers a part of the peripheral part of the seeded substrate 10 and is partially bent and brought into contact with the metal platform 56, thereby electrically connecting the metal platform 56 to the undercoat layer 12 and the seed layer 13. The conductive member 57 may be attachable to and removable from the seeded substrate 10.

A negative electrode of the power supply 54 is electrically connected to the undercoat layer 12 and the seed layer 13 of the seeded substrate 10 through the metal platform 56, and a positive electrode of the power supply 54 is electrically connected to the anode 51.

The metal layer 14 can be formed using the film-forming apparatus 50 in the manner described below.

As shower in FIG. 9, the seeded substrate 10 and the conductive member 57 are disposed at predetermined positions on the metal platform 56. As shown in FIG. 10, subsequently, the housing 53 is lowered to a predetermined level with the aid of the lifting and lowering device 55.

Subsequently, the metal solution L is pressurized with the aid of the pump 62. The pressure regulation valve 63 allows the pressure of the metal solution L in the housing 53 to be maintained at a predetermined level. The solid electrolyte membrane 52 is deformed to fit and come into contact with the surface of the seeded substrate 10 (i.e., the surface of the seed layer 13 and the surface of the water-repellent layer 16), thereby bringing the metal solution L contained in the solid electrolyte membrane 52 into contact with the seed layer 13. Because of water repellency of the surface of the water-repellent layer 16, on the other hand, the metal solution L contained in the solid electrolyte membrane 52 hardly comes into contact with the surface of the water-repellent layer 16. The solid electrolyte membrane 52 is uniformly pressed against the surface of the seed layer 13 and the surface of the water-repellent layer 16 by the pressure of the metal solution L in the housing 53.

The power supply 54 applies a voltage between the anode 51 and the seed layer 13, thereby causing metal ions contained in the metal solution L in contact with the seed layer 13 to be reduced to metal on the surface of the seed layer 13 and the metal to be deposited on the surface of the seed layer 13. On the other hand, reduction of the metal ions and deposition of the metal on the surface of the water-repellent layer 16 are prevented or reduced since the metal solution L hardly comes into contact with the surface of the water-repellent layer 16 as described above. Thus, the metal layer 14 is selectively formed on the surface of the seed layer 13.

After the metal layer 14 having a given thickness is formed, voltage application between the anode 51 and the seed layer 13 is terminated, and pressurization of the metal solution L by the pump 62 is terminated. The housing 53 is then lifted to a predetermined level (see FIG. 9), and the seeded substrate 10 on which the metal layer 14 is formed is then removed from the metal platform 56.

(5) Etching of Water-Repellent Layer and Undercoat Layer (S3)

Figure 7:
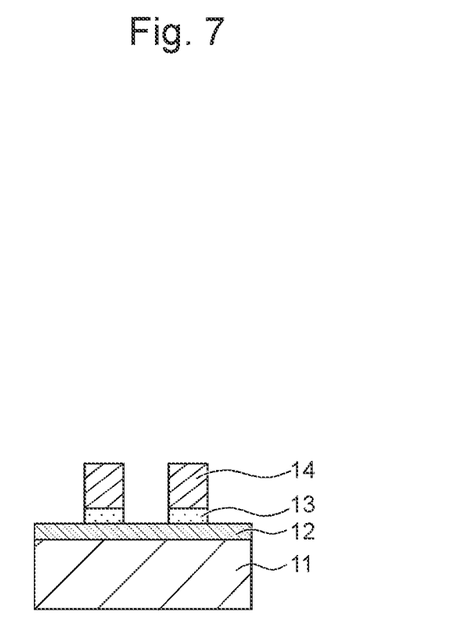
FIG. 7 is a drawing schematically illustrating a step of etching the water-repellent layer and the undercoat layer.
Figure 8:
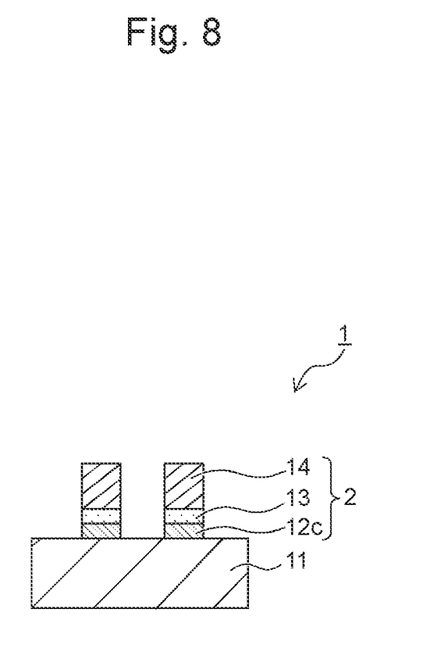
FIG. 8 is a drawing schematically illustrating the step of etching the water-repellent layer and the undercoat layer.

The water-repellent layer 16 (see FIG. 6) is etched as shown in FIG. 7, and the undercoat layer 12 (see FIG. 7) is then etched as shown in FIG. 8. In the etching of the undercoat layer 12, the metal layer 14 serves as a mask. Thus, a part 12c of the undercoat layer 12 underneath the metal layer 14 (hereafter, referred to as a "remaining undercoat layer 12c") remains on the insulation substrate 11 without being removed. As a result, a wiring layer 2 including the remaining undercoat layer 12c, the seed layer 13, and the metal layer 14 and having the predetermined wiring pattern is formed on the insulation substrate 11.

Either dry etching or wet etching may be used for etching. Examples of dry etching include reactive gas etching, sputter etching, plasma etching, reactive ion etching (RIE), reactive ion beam etching, radical etching, photo-excited etching, laser-assisted etching, and laser ablation etching. A method of reactive ion etching can involve the use of capacitively coupled plasma (CCP), inductively coupled plasma (ICP), or microwave ECR (Electron Cyclotron Resonance) plasma.

Etching gas or an etching solution may be appropriately selected depending on a material constituting the water-repellent layer 16 or the undercoat layer 12. Examples of etching gas include $CF_4$, $SF_6$, boron, chlorine, HBr, and $BCl_3$. Examples of etching solutions that can be used include an acid solution such as an HF solution and an alkaline solution. When the undercoat layer 12 is formed of $WSi_2$ or $ZrSi_2$, for example, the undercoat layer 12 can be etched via reactive ion etching with $CF_4$ gas. The water-repellent layer 16 formed with the use of organic silane or organic silazane can also be etched via reactive ion etching using $CF_4$ gas.

By the process as described above, the wiring substrate 1 including the insulation substrate 11 and the wiring layer 2 having the predetermined wiring pattern and provided on the insulation substrate 11 is produced.

In the present embodiment, the water-repellent layer 16 formed on the second region 12b of the surface of the undercoat layer 12 allows selective deposition of metal on the surface of the seed layer 13 in the step of forming the metal layer 14 (S2) as described above. In other words, the water-repellent layer 16 allows prevention or reduction of metal deposition in a region other than the predetermined wiring pattern.

Figure 11:
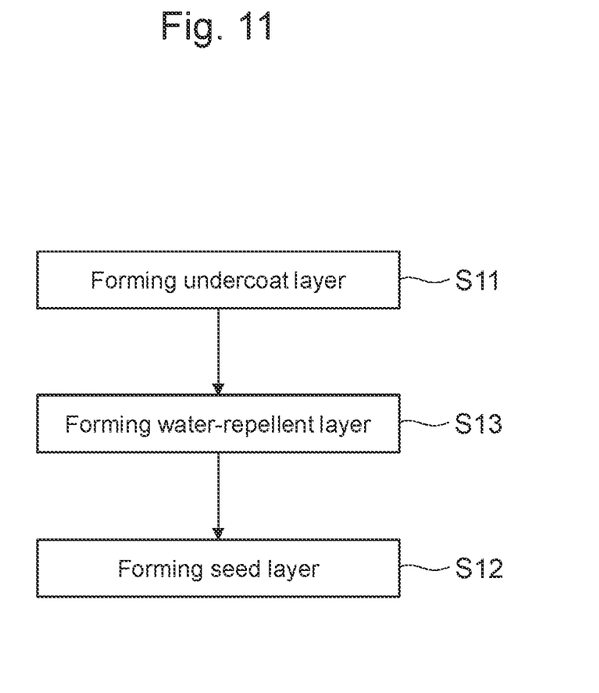
FIG. 11 is a flowchart showing a step of preparing a seeded substrate in a method for producing a wiring substrate according to a modified embodiment.

The embodiments of the present disclosure are described in detail above. It should be noted that the present disclosure is not limited to the embodiments described above and that various design modifications may be made without departing from the spirit and scope of the present disclosure described in the claims. For example, the step of preparing the seeded substrate (S1) may sequentially include: the step of forming the undercoat layer (S11); the step of forming the water-repellent layer 16 (S13); and the step of forming the seed layer (S12), as shown in FIG. 11. Specifically, the step of forming the water-repellent layer 16 (S13) may be followed by the step of forming a seed layer (S12). In such a case, the water-repellent layer 16 may be selectively formed on the second region 12b of the surface of the undercoat layer 12 via printing methods such as screen printing, inkjet printing, or transfer printing.

EXAMPLES

Hereafter, the present disclosure is specifically described with examples, but the present disclosure is not limited to these examples.

Example 1

A glass substrate was prepared as an insulation substrate. On the surface of the insulation substrate, a $WSi_2$ layer with a thickness of 300 nm was formed as an undercoat layer via sputtering. Subsequently, a Cu layer with a thickness of 300 nm and a predetermined pattern was formed as a seed layer on the surface of the undercoat layer by screen printing with the use of an ink containing copper nanoparticles. Subsequently, HMDS was applied via spin coating to form a water-repellent layer. The water-repellent layer was not formed on the seed layer, but it was formed selectively on a region of the surface of the undercoat layer which was not covered with the seed layer.

A Cu layer was formed as a metal layer on the surface of the seed layer via solid-electrolyte deposition. Specifically, the Cu layer was formed using the film-forming apparatus 50 shown in FIGS. 9 and 10 under the conditions described below.

Cathode: seed layer
Anode: oxygen-free copper wire
Solid electrolyte membrane: Nafion® (thickness: approximately 8 μm)
Metal solution: 1.0 mol/l of copper sulfate aqueous solution
Pressure for pressing the solid electrolyte membrane against the seed layer: 1.0 MPa
Voltage applied: 0.5 V
Current density: 0.23 mA/cm$^2$ Subsequently, the water-repellent layer and the undercoat layer were subjected to capacitively coupled plasma etching using $CF_4$ gas with the metal layer serving as a mask until the surface of the insulation substrate was exposed. As a result, a wiring layer having a predetermined wiring pattern and including the undercoat layer, the seed layer, and the metal layer was formed on the insulation substrate. A wiring substrate including the insulation substrate and the wiring layer was thus obtained.

Example 2

A wiring substrate was prepared in the same manner as in Example 1, except that the water-repellent layer was formed via thermal CVD using para-aminophenyltrimethoxysilane as a raw material gas.

Comparative Example

A wiring substrate was prepared in the same manner as in Example 1, except that the water-repellent layer was not formed.

Evaluation

The wiring substrate of Comparative Example was observed under a microscope (magnification: 100×). Deposition of Cu was observed in a region other than the region corresponding to the wiring pattern. Specifically, a Cu layer that was not included in the wiring layer was observed. On the basis of the microscopic image, a proportion of the area of the Cu layer that was not included in the wiring layer to the area of the region other than the region corresponding to the wiring pattern was calculated using an image analysis software "WinROOF", resulting in 1%.

The wiring substrates of Examples 1 and 2 were observed under a microscope in the same manner. Deposition of Cu was not observed in a region other than the region corresponding to the wiring pattern.

What is claimed is:

1. A method for producing a wiring substrate comprising an insulation substrate and a wiring layer having a predetermined wiring pattern and provided on the insulation substrate, the method comprising steps of:
   (a) preparing a seeded substrate comprising:
      the insulation substrate;
      a conductive undercoat layer provided on the insulation substrate and having a hydrophilic surface;
      a conductive seed layer provided on a first region of the surface of the undercoat layer, the first region having a predetermined pattern corresponding to the wiring pattern; and
      a water-repellent layer provided on a second region directly on the surface of the undercoat layer, the second region being a region other than the first region;
   (b) forming a metal layer on a surface of the seed layer, wherein a voltage is applied between an anode and the seed layer while a solid electrolyte membrane containing a metal ion-containing solution being disposed between the seeded substrate and the anode, and the solid electrolyte membrane and the seed layer being pressed into contact with each other; and
   (c) etching the water-repellent layer and the undercoat layer,
   wherein the undercoat layer includes a metal layer of at least one of Al or Cr, the metal layer having a natural oxide film on a surface thereof, and
   the water-repellent layer is not formed on the surface of the seed layer.

2. The method according to claim 1, wherein the step (a) comprises, in the sequence set forth:
   forming the undercoat layer on the insulation substrate;
   forming the seed layer on the first region of the surface of the undercoat layer; and
   forming the water-repellent layer on the second region directly on the surface of the undercoat layer.

3. The method according to claim 1, wherein the step (a) comprises, in the sequence set forth:
   forming the undercoat layer on the insulation substrate;
   forming the water-repellent layer on the second region directly on the surface of the undercoat layer; and
   forming the seed layer on the first region of the surface of the undercoat layer.

4. The method according to claim 1, wherein the undercoat layer has a hydroxyl group on its surface.

5. The method according to claim 1, wherein the step (a) comprises forming the water-repellent layer using organic silane or organic silazane.

* * * * *